United States Patent
Chu et al.

(10) Patent No.: US 6,380,072 B2
(45) Date of Patent: Apr. 30, 2002

(54) METALLIZING PROCESS OF SEMICONDUCTOR INDUSTRY

(75) Inventors: John Chu; Der-Tsyr Fan; Chon-Shin Jou; Ting S. Wang, all of Hsinchu (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/725,602

(22) Filed: Nov. 29, 2000

Related U.S. Application Data

(63) Continuation-in-part of application No. 09/129,059, filed on Aug. 4, 1998.

(51) Int. Cl.[7] .......................................... H01L 21/4763
(52) U.S. Cl. ........................................................ 438/636
(58) Field of Search ................................. 438/638, 653, 438/688, 128; 257/532

(56) References Cited

U.S. PATENT DOCUMENTS

| | | |
|---|---|---|
| 5,683,072 A | 11/1997 | Ohmi et al. |
| 5,712,140 A | 1/1998 | Ishii et al. |
| 5,920,081 A | 7/1999 | Chen et al. |
| 5,925,933 A | 7/1999 | Colgan et al. |
| 5,963,827 A | 10/1999 | Enomoto et al. |
| 6,078,072 A * | 6/2000 | Okudaira .................... 257/295 |
| 6,156,640 A * | 12/2000 | Tsai ............................ 438/636 |
| 6,177,351 B1 * | 1/2001 | Beratan ....................... 438/694 |

* cited by examiner

Primary Examiner—John F. Niebling
Assistant Examiner—Andre C Stevenson
(74) Attorney, Agent, or Firm—Greer, Burns & Crain, Ltd.

(57) ABSTRACT

A method for manufacturing a semiconductor device having an excellent metallization is provided. The method includes the steps of a). providing a semiconductor substrate, b) forming a conductive layer on the semiconductor substrate, c) forming a dielectric layer on the conductive layer, d) forming a titanium nitride layer directly on the dielectric layer without contacting the conductive layer, and e) patternizing the titanium nitride layer, the dielectric layer and the conductive layer, wherein the dielectric layer is used for avoiding spontaneous electrochemical reaction between the titanium nitride layer and the conductive layer,

18 Claims, 5 Drawing Sheets

METALLIZING PROCESS OF SEMICONDUCTOR INDUSTRY

The present invention is a continuation-in-part application of the parent application bearing Ser. No. 09/129,059 and filed on Aug. 4, 1998.

FIELD OF THE INVENTION

The present invention relates to a method for manufacturing a semiconductor device, and more particularly to a metallizing process for a semiconductor device.

BACKGROUND OF THE INVENTION

In an integrated circuit manufacturing process, the stressed point, after main parts of hundreds of thousands of transistors have been completed, is to interconnect them to present an integral electronic device. The process to so interconnect is generally referred to as a metallizing process.

For a semiconductor metallizing process, aluminum is the most popularly used material for the device runner. When the integration of the semiconductor device becomes higher an d higher, it would be difficult to use an aluminum-based runner again in that silicon exists a specific solid solubility with respect to aluminum and that the interface between silicon and aluminum will easily result in a spiking phenomenon through interdiffusion in a relatively high temperature to cause a poor contact between aluminum wire and MOS transistor. In addition, when the breadth of the aluminum becomes narrower as the device becomes smaller, the aluminum atom is caused to move by electromigration to result in an open state of the aluminum wire.

Accordingly, the present semiconductor manufacturing process adopts the aluminum alloy, e.g. AlCu alloy to serve as the conducting material for the semiconductor device. In order to further realize the metallization in the known technique, in FIGS. 1A~1D, we use the AlCu alloy serving as the conducting material to illustrate the metallizing process and shortcomings according to the prior art.

FIG. 1A schematically shows the following steps of providing a silicon substrate 11, forming on silicon substrate 11 by DC sputtering an AlCu alloy layer 12 having a thickness of about 5,000 Å~10,000 Å, and forming on AlCu alloy 12 a titanium nitride (TiN) layer 13 having a thickness of about 200 Å~1500 Å by reactive DC sputtering. It is to be noticed that in the general metallizing process for the semiconductor device, the metal layer is provided thereon with an anti-reflection layer of a conducting material in order to avoid a pattern transfer error in the photolithography process. As such, the purpose of forming titanium nitride (TiN) layer 13 is to prevent the surface of AlCu alloy 12 layer from reflection in order to secure the exposure exactitude for the subsequent photolithography process. Thus, the device runner is consisted of AlCu layer 12 and titanium nitride (TiN) layer 13. Since the material property of titanium nitride (TiN) layer 13 is hard and the curvature of the chip surface in the semiconductor process is not the same, titanium nitride (TiN) layer 13 is extremely prone to crack to form a crack 131 as shown in FIG. 1A.

After the anti-reflection titanium nitride (TiN) layer 13 is formed on AlCu layer 12, there are proceeded with photolithography and etching processes. The photoresist developer, e.g. the alkaline solution of sodium hydroxide (NaOH) or potassium hydroxide (KOH), the etching solution, e.g. a solution using the chloride as the primary reacting gas, or the washing agent used in the washing process will leak through crack 131. Since there exists an oxidizing potential difference between titanium nitride (TiN) layer 13 and AlCu alloy layer 12, there will be resulted in a local spontaneous electrochemical reaction, just like the function of a galvanic cell, to have an equivalent circuit diagram as shown in FIG. 1D where titanium nitride layer 13 serves as an anodic plate 14 and AlCu alloy layer 12 serves as a cathodic plate 15 in the concerned circuit. The spontaneous electrochemical reaction between two electrode plates 14, 15 converts the chemical energy into the electric energy. In addition to consume the material of AlCu alloy layer 12, the spontaneous electrochemical reaction will leave an unetchable by-product beneath AlCu alloy layer 12. The by-product, as shown in FIG. 1B, is an aluminum oxide ($Al_2O_3$) 121 having a thickness of about 30 Å~50 Å. This aluminum oxide 121 cannot be removed by the etching chloride plasma etching titanium nitride layer 13 and AlCu alloy layer 12.

Accordingly, the device runner having been subjected to an etching process will present an etched result as shown in FIG. 1C. Specifically, the AlCu alloy layer 12 right beneath aluminum oxide 121 will not be etched away and will present an AlCu alloy residue 122. AlCu alloy residue 122 will primarily explain why the runner of AlCu alloy layer 12 is short-circuited. Furthermore, since AlCu alloy layer 12 will be undesiredly partly etched away, it is impossible to obtain a correct runner-etching result to seriously adversely influence the required short-circuiting condition between device runners which should be overcome as soon as possible.

It is therefore tried by the Applicant to deal with the above situation encountered in the prior art.

SUMMARY OF THE INVENTION

It is therefore an object of the present invention to provide a process for metallizing a semiconductor device without an etching residue.

It is further an object of the present invention to provide a process for metallizing a semiconductor device having a desired runner pattern.

It is additional an object of the present invention to provide a process for metallizing a semiconductor device having a relatively high yield rate.

According to the present invention, a process for metallizing a semiconductor device comprising the steps of a) providing a semiconductor substrate, b) forming a conductive layer on the semiconductor substrate, c) forming a dielectric layer on the conductive layer, d) forming a titanium nitride layer directly on the dielectric layer without contacting the conductive layer, and e) patternizing the titanium nitride layer, the dielectric layer and the conductive layer, wherein the dielectric layer is used for avoiding spontaneous electrochemical reaction between the titanium nitride layer and the conductive layer.

Certainly, the step b) can be executed by a reactive DC sputtering. The conductive layer can be a metal layer which can be made of an AlCu alloy. The conductive layer can have a thickness ranged from 5,000 Å~10,000 Å. The step c) can be executed by oxidation.

Further, the dielectric layer can be an oxide layer which can be an aluminum oxide ($Al_2O_3$) layer having a thickness ranged from 10 Å to 20 Å, or a silicon dioxide ($SiO_2$) layer having a thickness ranged from 10 Å to 50 Å.

Certainly, the step c) can be executed by nitridation. The dielectric layer can be a nitride layer which can be an aluminum nitride (AlN) having a thickness ranged from 10 Å to 50Å.

Still more, the step d) can be executed by a reactive DC sputtering. The titanium nitride (TiN) layer can have a thickness ranged from 200 Å~1,500 Å.

Preferably the step e) further includes the following sub-steps of e1) executing a photolithography process according to a specific runner pattern to cover a photoresist layer on the titanium nitride layer, e2) executing a first etching process to etch away portions of the titanium nitride layer, the dielectric layer and the conductive layer not covered by the photoresist layer, and e3) executing a second etching process to etch away the photoresist layer, the titanium nitride layer and the dielectric layer.

The present invention may best be understood through the following descriptions with reference to the accompanying drawings, in which:

DETAILED DESCRIPTION OF THE PREFERRED EMBODIMENT

Figure 1A:
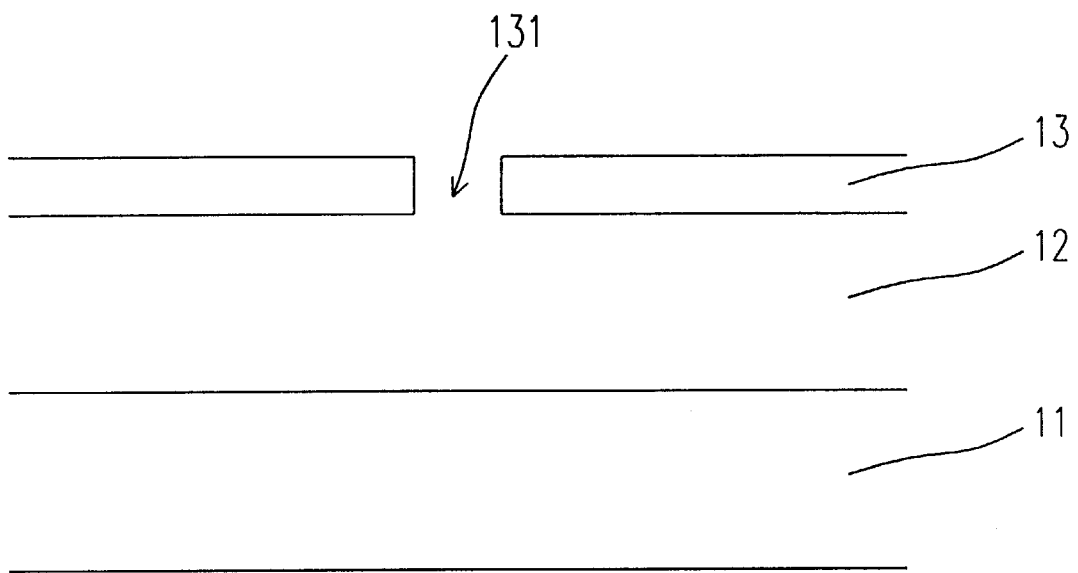
FIGS. 1A~1D are schematical views showing and/or equivalent circuit diagram for the steps of a prior method for metallizing a semiconductor device.
Figure 1B:
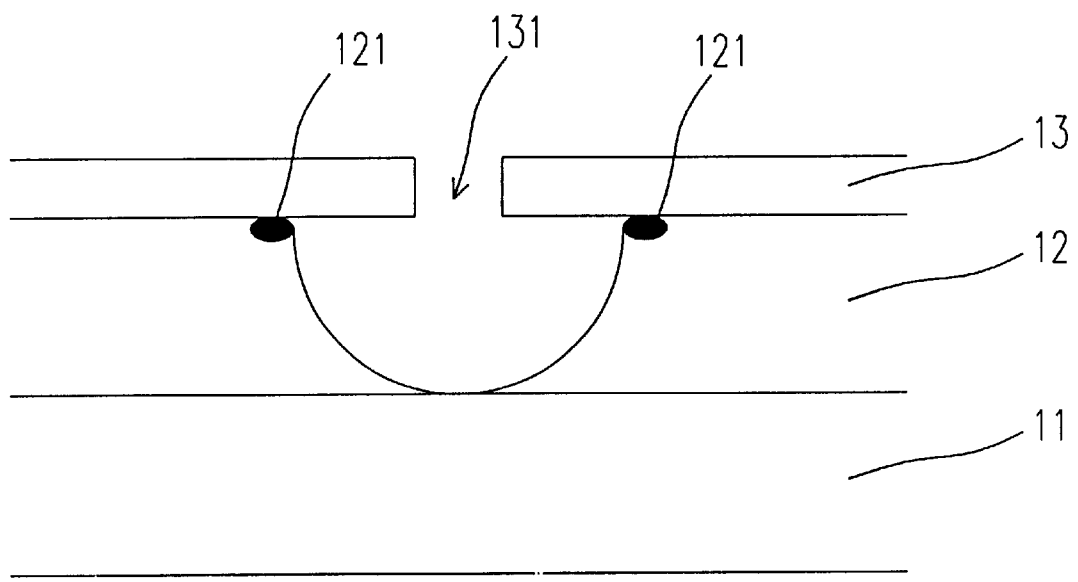
Figure 1C:
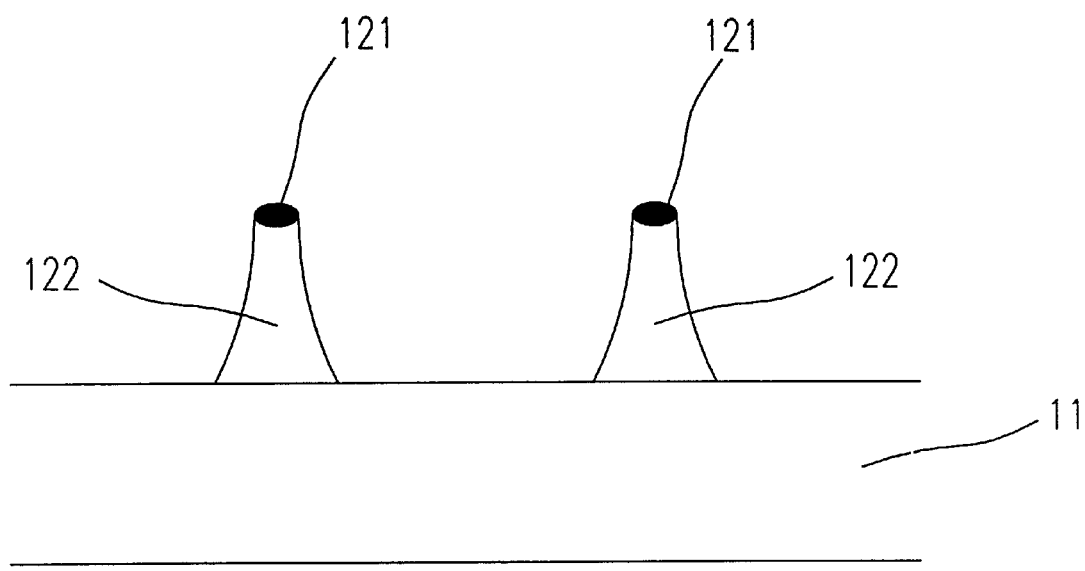
Figure 1D:
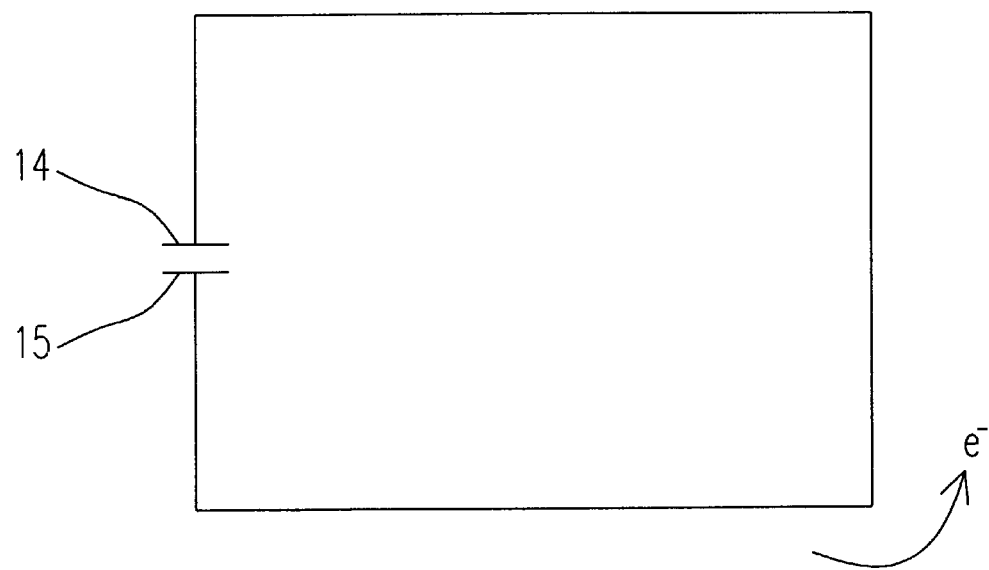

Referring now to FIGS. 2A~2E, there is shown a preferred embodiment of the steps of a method for metallizing a semiconductor device according to the present invention. FIG. 1A schematically shows the following steps of providing a silicon substrate 21, and forming on silicon substrate 21 by DC sputtering an AlCu alloy layer 22 having a thickness of about 5,000 Å~10,000 Å. FIG. 1B shows a step of forming by oxidation on AlCu alloy 22 a dielectric layer 23 being an oxide layer. Preferably the oxide layer 23 is an aluminum oxide ($Al_2O_3$) layer having a thickness of about 10 Å~20 Å, or a silicon dioxide layer having a thickness of about 10 Å~50 Å.

Alternatively, the dielectric layer 23 can be obtained through nitridation to form a nitride layer. Preferably the nitride layer 23 is an aluminum nitride (AlN) layer having a thickness of about 10 Å~50 Å.

Certainly, the oxidization or nitridation reaction can be proceeded in the following manner.
1. Like the cluster tool measure, after sputtered, AlCu alloy layer 22 will be placed in a reaction chamber filled with oxygen gas ($O_2$) or nitrogen gas ($N_2$) to form on AlCu alloy 22 by such so-called "vacuum-rupturing" procedure an oxide or nitride layer 23 to be further deposited thereon the titanium nitride layer 24. It is to be noticed that the procedure for forming the oxide or nitride layer 23 is cost-effective and simple.
2. Alternatively, while AlCu alloy layer 22 is continuously sputtered, the system is supplied with an oxygen or nitrogen plasma to form on AlCu alloy layer 22 the oxide or nitride layer 23 to be covered thereon with titanium nitride layer 24. Such process for forming the oxide or nitride layer 23 can be exactly controlled and can obtain a desired thickness therefor.

Since the oxide layer, i.e. aluminum oxide layer 23, obtained through the above procedure has a thickness of about 10 Å~20 Å which is very thin and can be easily removed by the subsequent etching process.

Figure 2A:
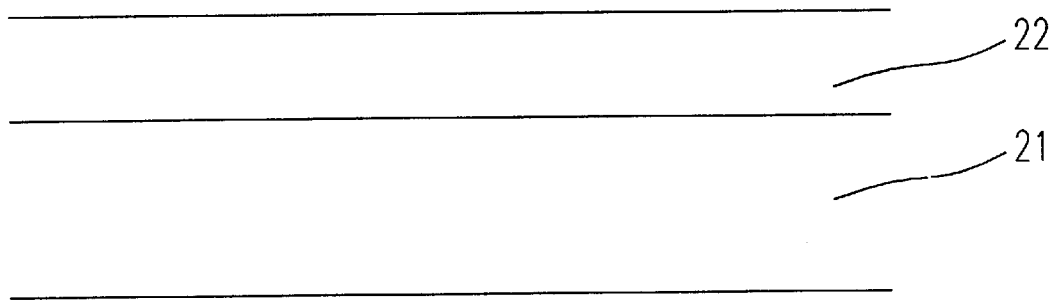
FIGS. 2A~2E are schematical views showing and/or equivalent circuit diagram for the steps of a preferred embodiment of a method for metallizing a semiconductor device according to the present invention.
Figure 2B:
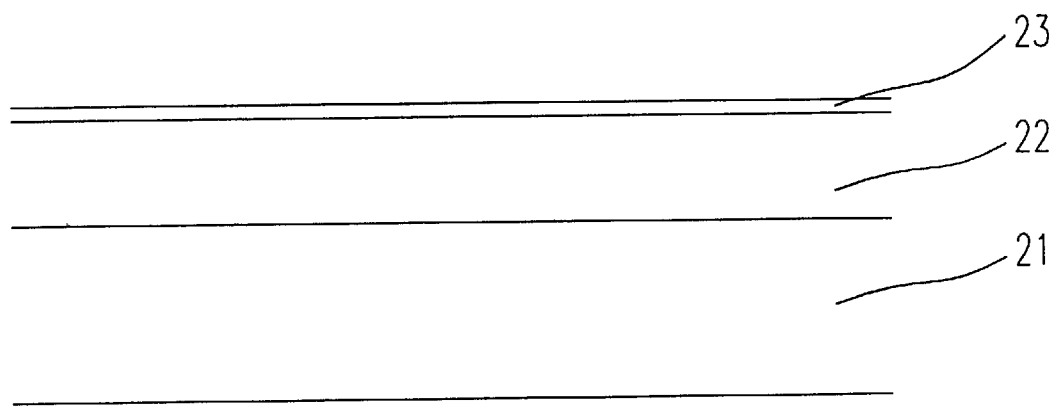
Figure 2C:
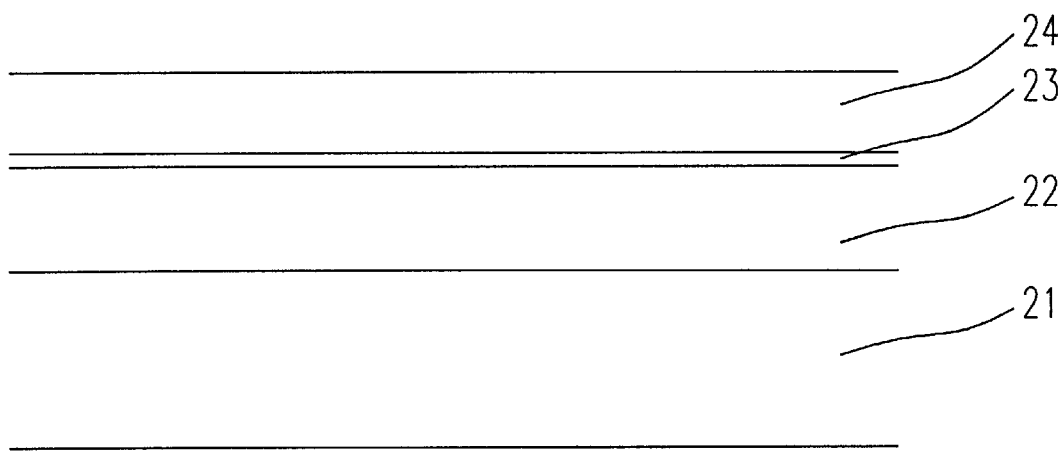

FIG. 2C schematically shows the step of forming by reactive DC sputtering on dielectric layer 23 a titanium nitride (TiN) layer 24 which has a thickness of about 200 Å~1,500 Å and serves as an anti-reflection layer to prevent a pattern transfer error in the subsequent photolithography process.

Figure 2D:
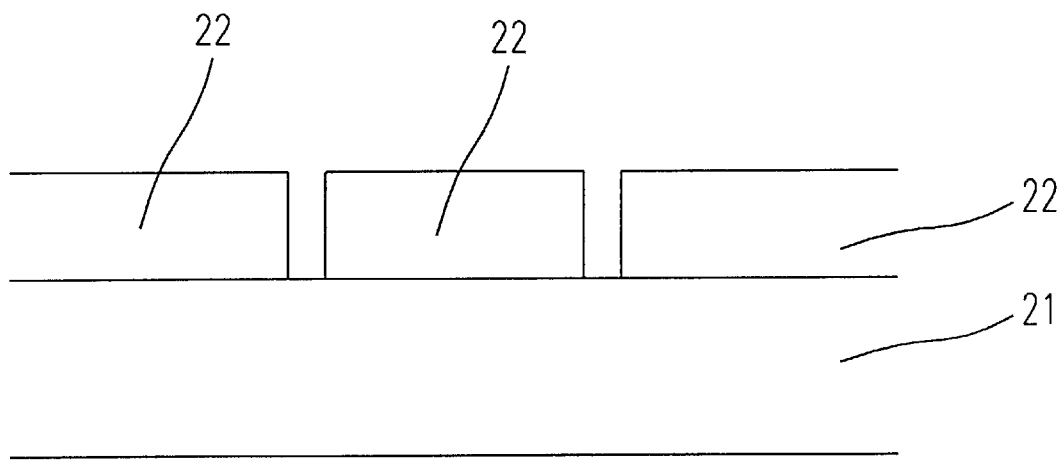

FIG. 2D schematically shows the steps of executing a photolithography process to form a photoresistant layer on titanium nitride (TiN) layer 24 according to the desired runner pattern, executing an etching process to remove AlCu layer 22, dielectric layer 23 and titanium nitride (TiN) layer 24 which are not covered by the photoresistant layer, and executing a further etching process to remove the photoresistant layer, titanium nitride (TiN) layer 24 and dielectric layer 23 to obtain AlCu alloy layer 22 having a pattern the same with the desired runner pattern to complete the metallizing process. While the photolithography and etching processes are proceeded, even if in titanium nitride (TiN) layer 24, there is a crack through which the photoresist developer, etching solution or the washing agent leaks, the spontaneous electrochemical reaction between titanium nitride 24 and AlCu alloy layer 22 will be avoided through the provision of dielectric layer 23 having a high impedance.

Figure 2E:
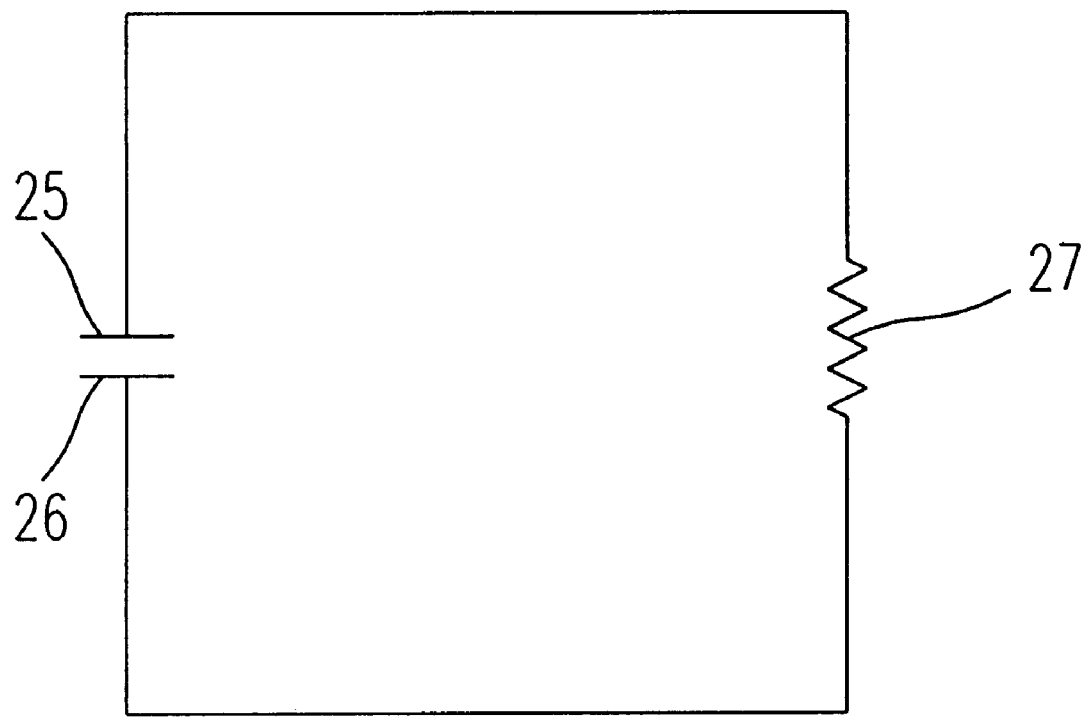

FIG. 2E schematically shows an equivalent circuit diagram according to the present invention where titanium nitride layer 24 serves as an anodic plate 25, AlCu alloy layer 22 serves as a cathodic plate 26 in the concerned circuit, and dielectric layer 23 equals to a high impedance material. In this equivalent circuit, the reaction speed of the spontaneous electrochemical reaction between two electrode plates 25, 26 is effectively retarded by high impedance material 27.

Thus, since the present invention exists no metal residue as in the prior art, not only the short-circuiting phenomenon in AlCu alloy layer 22 is prevented but also a correct runner etching result is obtained and a lower rejection rate is possible.

In sum, according to the present method for metallizing a semiconductor device, it includes the steps of a) providing a semiconductor substrate, b) forming a conductive layer on the semiconductor substrate, c) forming a dielectric layer on the conductive layer, d) forming a titanium nitride layer on the dielectric layer, and e) patternizing the titanium nitride layer, the dielectric layer and the conductive layer. The spontaneous electrochemical reaction between the titanium nitride layer and the conducting layer will be avoided through the provision of the dielectric layer having a high impedance since the etched runner residue is obviated.

While the invention has been described in terms of what are presently conedgered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claim is:
1. A metallizing process for metallizing a semiconductor device comprising the steps of:
   a) providing a semiconductor substrate;
   b) forming a conductive layer on said semiconductor substrate;
   c) forming a dielectric layer on said conductive layer;
   d) forming a titanium nitride layer directly on said dielectric layer and without contacting said conductive layer; and e) patternizing said titanium nitride layer, said dielectric layer and said conductive layer, wherein said (dielectric layer is used for avoiding spontaneous electrochemical reaction between said titanium nitride layer and said conductive layer.

2. The metallizing process according to claim 1 wherein said step b) is executed by a reactive DC sputtering.

3. The metallizing process according to claim 1 wherein said conductive layer is a metal layer.

4. The metallizing process according to claim 3, wherein said metal layer is made of an AlCu alloy.

5. The metallizing process according to claim 1 wherein said conductive layer has a thickness ranged from 5,000 Å~10,000 Å.

6. The metallizing process according to claim 1 wherein said step c) is executed by oxidation.

7. The metallizing process according to claim 6 wherein said dielectric layer is an oxide layer.

8. The metallizing process according to claim 7 wherein said oxide layer is an aluminum oxide ($Al_2O_3$) layer.

9. The metallizing process according to claim 8 wherein said aluminum oxide layer has a thickness ranged from 10 Å to 20 Å.

10. The metallizing process according to claim 7 wherein said oxide layer is a silicon dioxide ($SiO_2$) layer.

11. The metallizing process according to claim 10 wherein said silicon dioxide layer has a thickness ranged from 10 Å to 50 Å.

12. The metallizing process according to claim 1 wherein said step c) is executed by nitridation.

13. The metallizing process according to claim 1 wherein said dielectric layer is a nitride layer.

14. The metallizing process according to claim 13 wherein said nitride layer is an aluminum nitride (AlN) layer.

15. The metallizing process according to claim 14 wherein said aluminum nitride layer has a thickness ranged from 10 Å to 50 Å.

16. The metallizing process according to claim 1 wherein said step d) is executed by a reactive DC sputtering.

17. The metallizing process according to claim 1 wherein said titanium nitride layer having a thickness ranged from 200 Å~1,500 Å.

18. The metallizing process according to claim 1 wherein said step e) further includes the following sub-steps of:

e1) executing a photolithography process according to a specific runner pattern to cover a photoresist layer on said titanium nitride layer;

e2) executing a first etching process to etch away portions of said titanium nitride layer, said dielectric layer and said conductive layer not covered by said photoresist layer; and e3) executing a second etching process to etch away said photoresist layer, said titanium nitride layer and said dielectric layer.

* * * * *